(12) United States Patent
Jia et al.

(10) Patent No.: US 9,831,430 B2
(45) Date of Patent: Nov. 28, 2017

(54) EVAPORATION SYSTEM AND FABRICATING METHOD AND EVAPORATION METHOD THEREOF

(71) Applicant: BOE TECHNOLOGY GROUP CO., LTD., Beijing (CN)

(72) Inventors: Wenbin Jia, Beijing (CN); Rui Peng, Beijing (CN); Xinwei Gao, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/098,470

(22) Filed: Apr. 14, 2016

(65) Prior Publication Data

US 2017/0092860 A1 Mar. 30, 2017

(30) Foreign Application Priority Data

Sep. 25, 2015 (CN) .......................... 2015 1 0624848

(51) Int. Cl.
*H01L 51/00* (2006.01)
*H01L 51/56* (2006.01)

(52) U.S. Cl.
CPC .......... *H01L 51/0008* (2013.01); *H01L 51/56* (2013.01)

(58) Field of Classification Search
None
See application file for complete search history.

(56) References Cited

U.S. PATENT DOCUMENTS

| 2011/0104398 | A1* | 5/2011 | Korevaar | C23C 14/228 427/561 |
| 2013/0267055 | A1* | 10/2013 | Ro | C23C 14/04 438/46 |
| 2015/0014636 | A1* | 1/2015 | Kang | H01L 51/5253 257/40 |

FOREIGN PATENT DOCUMENTS

| CN | 101619442 A | 1/2010 |
| CN | 101845610 A | 9/2010 |
| CN | 203411600 U | 1/2014 |

OTHER PUBLICATIONS

China Office Action, Application No. 201510624848.6, dated Apr. 6, 2017, 19 pps.: with English Translation.

* cited by examiner

*Primary Examiner* — Asok K Sarkar
(74) *Attorney, Agent, or Firm* — Armstrong Teasdale LLP

(57) ABSTRACT

An evaporation source is provided. The evaporation source includes a substrate, a plurality of recesses spaced from each other and arranged on the substrate, and a plurality of heating sources arranged within the plurality of recesses.

7 Claims, 3 Drawing Sheets

EVAPORATION SYSTEM AND FABRICATING METHOD AND EVAPORATION METHOD THEREOF

CROSS REFERENCE TO RELATED APPLICATIONS

This application claims the benefit and priority to Chinese Patent Application No. 201510624848.6 filed on Sep. 25, 2015, the entire content of which is incorporated herein by reference.

BACKGROUND

The present invention generally relates to display technologies, and more particularly, to an evaporation source and fabricating method thereof, and an evaporation method using such evaporation source.

Organic Light Emitting Diode (OLED) display panel has gradually become a mainstream display panel in the display field due to its advantages such as auto-luminescence, quick response time, high luminance, light weight, etc.

An OLED display panel may include a plurality of sub-pixel units arranged in arrays. The sub-pixel unit may include an anode, a light-emitting layer and a cathode. The light-emitting layer may be formed with organic electroluminescent materials. Currently, the light-emitting layer is usually formed through an evaporation process by using a metal mask. Light-emitting layers with different colors may be made using different metal masks. However, the use of the metal mask may give rise to several problems. For example, with respect to the large-size display panel, the metal mask strap may tend to hang down due to gravity. As a result, obvious shadow effect may occur during the evaporation process, so as to affect emitting efficiency and color of the sub-pixel units. With respect to the small-size display panel, the light-emitting layer is usually formed using fine metal mask (FMM). However, it may be difficult to fabricate the display panel with high resolution, because of the limitation to the FMM's fabrication precision.

BRIEF DESCRIPTION

Embodiments described herein provide an evaporation source and fabricating method thereof, and an evaporation method using such evaporation source, which can fabricate the light-emitting layers for the OLED display panel without the metal mask.

In one aspect, an evaporation source is provided. The evaporation source includes a substrate, a plurality of recesses spaced from each other arranged on the substrate, and a plurality of heating sources arranged within the plurality of recesses.

In an embodiment, the recesses are separated by isolation wall structures, which are made of a thermal insulation material.

In an embodiment, the heating source includes a heating resistance layer arranged at the bottom of the recess, and a pulse generation device arranged to transmit an electrical pulse signal to the heating resistance layer. The heating resistance layers within the plurality of recesses are electrically insulated from each other.

In an embodiment, the evaporation source further includes a cooling device, which is arranged to cool a substrate to be evaporated.

In an embodiment, the plurality of recesses is arranged in a matrix.

In another aspect, an evaporation method using the above evaporation source is provided. In this method, organic electroluminescent materials are deposited in at least a part of the plurality of recesses of the evaporation source, and the evaporation source is attached to a substrate to be evaporated, such that the at least a part of the recesses of the evaporation source is aligned with sub-pixel units of the substrate to be evaporated. The organic electroluminescent materials in the at least a part of the recesses are heated by a heating source of the evaporation source, so as to form light-emitting layers on the sub-pixel units aligned with the at least a part of recesses.

In an embodiment, the organic electroluminescent materials in the at least a part of the recesses are different.

In an embodiment, each recess of the at least a part of the recesses is aligned with one of, or a row of, or a column of the sub-pixel units in the substrate to be evaporated.

In an embodiment, the evaporation method may further include cooling the substrate to be evaporated while heating the organic electroluminescent materials.

In another aspect, a method for fabricating an evaporation source is provided. In this method, a plurality of recesses spaced from each other is formed on a substrate, wherein a plurality of heating sources is arranged within the plurality of recesses.

In an embodiment, firstly a plurality of heating sources is formed on the substrate, and then an isolation wall structure is formed in respective areas between the plurality heating sources, so as to form the plurality of recesses.

In an embodiment, the heating source includes a heating resistance layer arranged on the bottom of the recesses, and a pulse generation device arranged to transmit an electrical pulse signal to the heating resistance layer. The heating resistance layers in the plurality of the recesses are electrically insulated from each other.

BRIEF DESCRIPTION OF THE DRAWINGS

For the purpose of illustrating technical features of embodiments described herein more apparently, a brief illustration will be made for the drawings of embodiments below. It should be understand that, the drawings described hereinafter only relate to a part of the embodiments of the disclosure, but in no way limit the scope of the disclosure. In these drawings.

Technical features and advantages of the embodiments described herein can be appreciated more apparently, with reference to the accompanying drawings. The embodiments described below are only a part of the embodiments of the disclosure, but not all the embodiments of the disclosure. Based on the embodiments described below, all the other embodiments, gained by the skilled in the art without creative work, belong to the protection scope of the disclosure.

In an example embodiment, the evaporation source may include a substrate, a plurality of recesses spaced from each other, and a plurality of heating sources. The plurality of recesses is arranged on the substrate. Each of the heating sources is arranged within each of the plurality of recesses.

In the evaporation method of the example embodiment, at least a part of or all of the recesses are arranged with the organic electroluminescent materials. Then the evaporation source is closely attached to a substrate to be evaporated. The organic electroluminescent materials in the recesses may be heated by the heating source in the evaporation source, to form a light-emitting layer on the sub-pixel unit aligned with each recess. In this way, the light-emitting layer can be formed without a metal mask.

Figure 1:
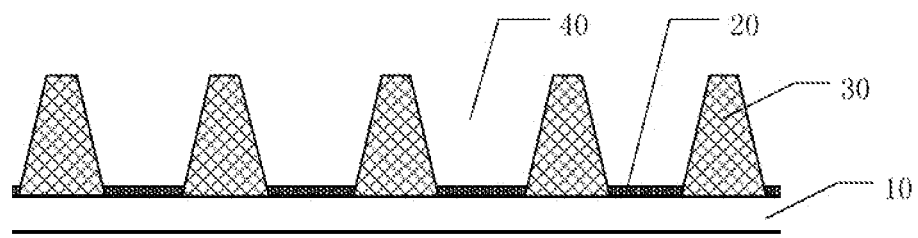
FIG. 1 is a schematic diagram illustrating an evaporation source according to an embodiment.

FIG. 1 schematically illustrates the evaporation source according to an example embodiment. The evaporation source includes a substrate 10, as shown in FIG. 1. A plurality of recesses 40 are arranged on the substrate 10 and are spaced from each other. In some embodiments, every two recesses 40 may be separated by an isolation wall structure 30. In some embodiments, the isolation wall structure 30 may be formed as a platform with a trapezoidal cross section. In this way, the recess may have sufficient evaporation space for the organic electroluminescent material deposited in that recess. In some embodiments, the isolation wall structure 30 may be made of a thermal insulation material.

Furthermore, a heating source 20 is arranged on the bottom of the recess 40 of the evaporation source. In an embodiment, the heating source 20 may include a heating resistance layer 20 and a pulse generation device which transmits an electrical pulse signal to the heating resistance layer 20. The heating resistance layer, for example, may be a metal layer formed with molybdenum (Mo). The pulse generation device may transmit the electrical pulse signal to the heating resistance layer to make the temperature of the heating resistance layer rise, so that the organic electroluminescent materials deposited in the recess 40 can be heated. Different organic electroluminescent materials have different evaporation temperatures. According to the nature of the organic electroluminescent material, its evaporation temperature can be determined. The pulse generation device may adjust the electrical pulse signal applied to the heating resistance layer according to the evaporation temperature. Thus, the heating resistance layer may be heated up to different temperatures, so as to heat the different organic electroluminescent materials.

In the case that there are different organic electroluminescent materials deposited in the plurality of recesses 40, the pulse generation device of the heating source in each recess 20 may generate and transmit to the heating resistance layer the electrical pulse signal corresponding to the organic electroluminescent material. The heating resistance layers in the recesses 40 may be heated up to the corresponding temperatures. In this way, simultaneous evaporation to the plurality of the organic electroluminescent materials can be achieved. For example, simultaneous evaporation to three electroluminescent materials which emit red, green, and blue light respectively can be achieved.

The evaporation source according to the embodiments of the disclosure may be used to fabricate the light-emitting layer in an OLED array substrate. In this case, the shape and arrangement of the recesses in the evaporation source may be arranged in accordance with the shape and arrangement of the sub-pixel units in the OLED array substrate. For example, the evaporation source may be provided with the same number of recesses as the sub-pixel units in the OLED array substrate, and the shape and arrangement of the recesses may be arranged in the same way as the shape and arrangement of the sub-pixel units in the OLED array substrate. In this way, once the evaporation source is attached to and aligned with the OLED array substrate, each of the sub-pixel units in the OLED array substrate is directly aligned with one of the recesses in the evaporation source. Since the sub-pixel units in the OLED array substrate are normally arranged in a matrix, the recesses in the evaporation source may also be arranged in a matrix on the substrate, as shown in FIG. 2.

In an embodiment, the organic electroluminescent material may be deposited in each recess. By heating the organic electroluminescent material with the heating source, the light-emitting layer can be formed on the sub-pixel unit of the OLED array substrate. As different organic electroluminescent materials have different physical properties and different evaporation temperatures, the heating sources in the recesses deposited with different organic electroluminescent materials may be independently controlled to rise to different heating temperatures, so as to control the evaporation process accurately and improve the evaporation effect.

Figure 2:
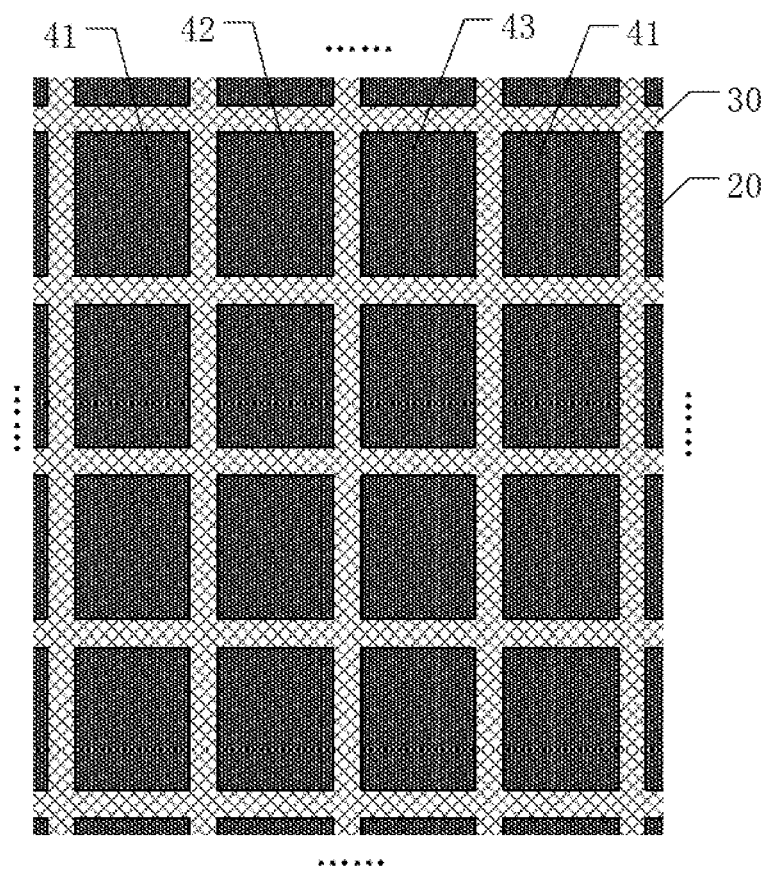
FIG. 2 is a schematic diagram illustrating the recesses of the evaporation source according to an embodiment.

For example, as shown in FIG. 2, a first organic electroluminescent material is deposited in a first recess 41 to, for example, form a light emitting layer for emitting red light. A second organic electroluminescent material is deposited in a second recess 42 to, for example, form a light emitting layer for emitting green light. A third organic electroluminescent material is deposited in a third recess 43 to, for example, form a light emitting layer for emitting blue light.

To heat the different organic electroluminescent materials at different temperatures, the heating resistance layer of the first recess 41, the heating resistance layer of the second recess 42 and the heating resistance layer of the third recess 43 are electrically insulated from each other, so that different electrical signals may be applied to these heating resistance layers of the three recesses 41, 42, 43 to achieve different heating temperatures.

In addition, the sub-pixel units in the same row or column in the OLED array substrate often illuminate with the same color. For the arrangement of the recess as shown in FIG. 2, the heating resistance layers in a row or column of the recesses deposited with the same organic electroluminescent material may be electrically connected to simplify the heating circuit.

Further, in order to ensure the organic electroluminescent materials can be smoothly evaporated onto the OLED array substrate from the evaporation source, in some embodiments, the evaporation source may further include a cooling device which is configured to cool the substrate to be evaporated while the organic electroluminescent material in the recesses is being heated by the heating source. Specifically, the cooling device may be arranged at a plane of the OLED array substrate facing away from the evaporation source. In this way, the organic electroluminescent material may be better phase changed when it is evaporated onto the surface area of the OLED array substrate, and thus the evaporation efficiency can be improved.

Figure 3:
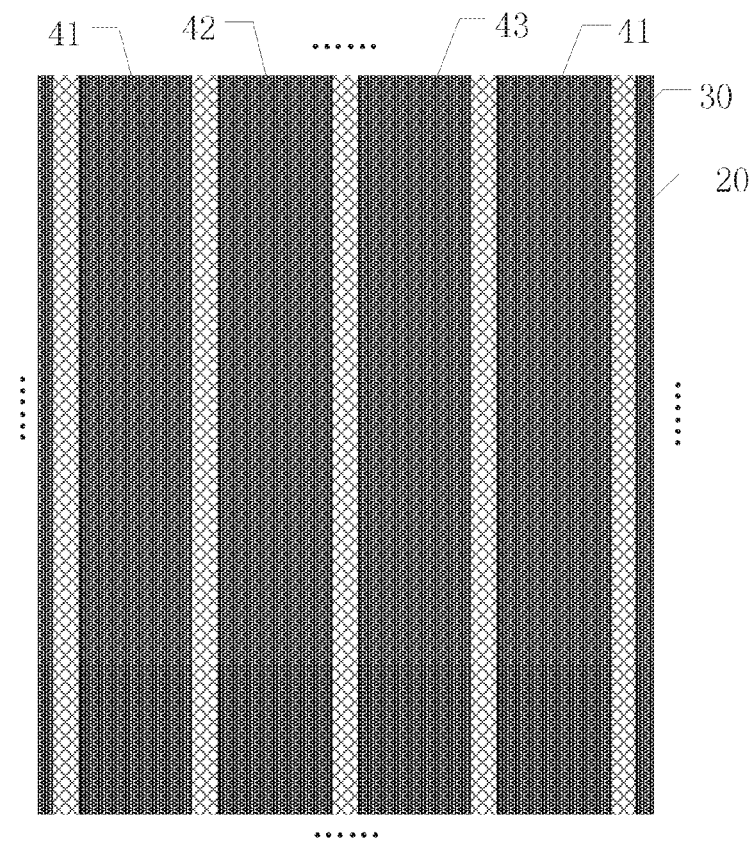
FIG. 3 is a schematic diagram illustrating the recesses of the evaporation source according to another embodiment.

In other embodiments, as the sub-pixel units in the same row or column in the OLED array substrate often illuminate with the same color, each recess of the evaporation source may be arranged to correspond to a row or column of the sub-pixel units in the OLED array substrate, in order to reduce the number of the recesses in the evaporation source. In this way, when the evaporation source is attached to and aligned to the OLED array substrate, each of the recesses can be aligned to a row or column of sub-pixel units in the OLED array substrate, and thus the light-emitting layer for a row or column of sub-pixel units can be formed using one recess. As an example, as shown in FIG. 3, each of the recesses in the evaporation source is arranged to correspond to a column of sub-pixel units which illuminate with the same color of the OLED array substrate. In this example, the number of the recesses is identical with that of the columns of sub-pixel unit of the OLED array substrate.

With the evaporation source according to the embodiments of the disclosure, the light-emitting layer for the respective sub-pixel units in the OLED array substrate can be formed without using a metal mask. Compared to the existing evaporation process, the evaporation method of the embodiments of the disclosure can shorten the process flow, reduce the process time, save the cost and can be applicable to the manufacture of the large-size display panels.

Figure 4:
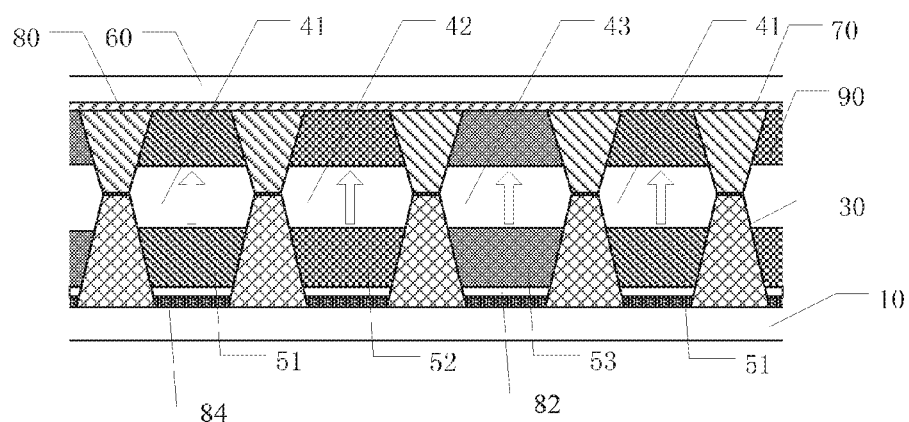
FIG. 4 is a schematic diagram illustrating the evaporation using the evaporation source according to an embodiment.
Figure 5:
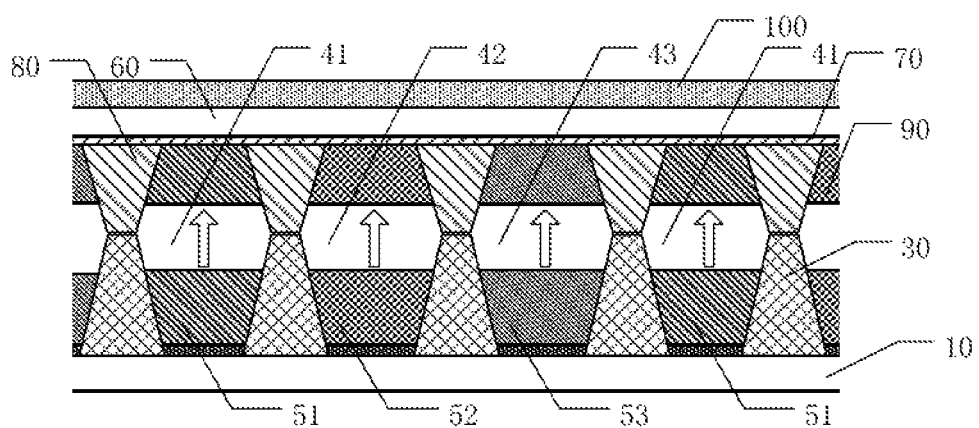
FIG. 5 is a schematic diagram illustrating the evaporation using the evaporation source according to another embodiment.

Next the evaporation method using the evaporation source according to the embodiments of the disclosure will be illustrated in conjunction with FIG. 4 and FIG. 5.

As shown in FIG. 4, the OLED array substrate to be evaporated includes a substrate 60, a thin film transistor (TFT) layer 70 arranged on the substrate 60, and a pixel-defining layer 80. The OLED array substrate is divided into multiple sub-pixel units arranged in a matrix by the pixel-defining layer 80. In the process of evaporation to the OLED array substrate using the evaporation source shown in FIG. 1 to FIG. 3, firstly, the recesses of the evaporation source is deposited with the organic electroluminescent material according to the configuration of the OLED array substrate. A person skilled in the art will appreciate that a part or all of the recesses of the evaporation source may be used in accordance with the configuration of the OLED array substrate. Specifically, the organic electroluminescent material may be deposited within the recesses with Drop Filling process. The Drop Filling process may use Ink-Jet Printing technique, for example. In the example, assume that a red light-emitting layer, a green light-emitting layer and a blue light-emitting layer are required to be formed on the OLED array substrate. Firstly, the first recess 41 of the evaporation source is deposited with a first organic electroluminescent material 51 (e.g., the material for emitting red light), the second recess 42 is deposited with a second organic electroluminescent material 52 (e.g., the material for emitting green light), and the third recess 43 is arranged with a third organic electroluminescent material 53 (e.g., the material for emitting blue light), by means of the ink-jet printing based drop filling process. Thereafter, the evaporation source and the OLED array substrate are attached together, such that the recesses of the evaporation source deposited with organic electroluminescent materials are aligned with the sub-pixel units in the OLED array substrate respectively. Each recess may correspond to one or a row or column of sub-pixel units in the OLED array substrate, for example. Then, the heating resistance layers 82 in the first recess 41, the second recess 42 and the third recess 43 are applied with different electrical pulse signals by the pulse generation device 84, whereby the light-emitting layer 90 (i.e., electroluminescent layer) can be formed on the respective sub-pixel units of the OLED array substrate.

Furthermore, the substrate to be evaporated may be cooled while the organic electroluminescent material in each recess is heated by the heating source. As shown in FIG. 5, the cooling device 100 may be arranged at the plane of the substrate 60 facing away from the substrate 10. During the evaporation process, the OLED array substrate can be cooled by the cooling device 100. In this way, the organic electroluminescent material can be better phase changed when it is evaporated onto the surface area of the OLED array substrate, and thus the evaporation efficiency can be improved.

With the evaporation method using the evaporation source shown in FIG. 1 to FIG. 3 in accordance with the embodiments of the disclosure, the light-emitting layer for the respective sub-pixel units of the OLED array substrate can be formed without using a metal mask. Compared to the existing evaporation process, it can shorten the process flow, reduce the process time, and can be applicable to the manufacture of the large-size display panel. Moreover, compared to the existing method which forms the light-emitting layer on the OLED array substrate directly using the ink-jet printing technique, the evaporation method of the embodiments of the disclosure uses the ink-jet printing technique to deposit the organic electroluminescent materials in the recesses of the evaporation source, and evaporates the organic electroluminescent materials onto the OLED array substrate by heating, so as to form the light-emitting layer. As the light-emitting layer is not directly formed on the OLED array substrate, the ink unevenness due to the ink-jet printing can be eliminated. Moreover, evaporation of the organic electroluminescent materials onto the respective sub-pixel units of the OLED array substrate can enhance the processing accuracy, facilitate control of the thickness of the light-emitting layer, and increase the evaporation efficiency.

Furthermore, an example embodiment provides a method for fabricating the evaporation sources as shown in FIG. 1 to FIG. 3. In the method, a plurality of recesses spaced from each other is formed on the substrate, and the plurality of recesses is arranged with a plurality of heating sources.

In an example embodiment, the plurality of heating sources may be formed on the substrate. Then, an isolation wall structure is formed in the respective areas between the plurality of heating sources, so as to form the plurality of recesses. For example, the isolation wall structure may be made of a material having excellent heat insulation. Specifically, the heat insulation material may be coated onto the substrate, and then the isolation wall structure is formed by the exposure process, development process and etc.

In some embodiments of the disclosure, the isolation wall structure may be a platform with a trapezoidal cross section. In this way, the recess may have sufficient evaporation space to evaporate the organic electroluminescent material.

In some embodiments of disclosure, the heating source may include a heating resistance layer arranged on the bottom of the recess, and a pulse generation device arranged to transmit the electrical pulse signal to the heating resistance layer. The heating resistance layers within the plurality of recesses are electrically insulated from each other.

The example embodiments of the disclosure have been described in detail above, which is intended to illustrate, but not limit the disclosure. Obviously, those skilled in the art may make various modifications and variations to the embodiments of the disclosure, without departing from the scope and spirit of the present invention. All such modifications and variations are intended to be included in the scope of the disclosure.

What is claimed is:
1. An evaporation system, comprising an evaporation source and an array substrate to be evaporated, wherein the evaporation source comprises:
  a substrate;
  a plurality of recesses spaced from each other and arranged on the substrate; and a plurality of heating sources arranged within the plurality of recesses, wherein each of the plurality of heating sources comprises:

a heating resistance layer arranged on a bottom of an associated recess of the plurality of recesses, and a pulse generation device configured to transmit an electrical pulse signal to the heating resistance layer, wherein the heating resistance layers within the plurality of recesses are electrically insulated from each other, wherein the plurality of recesses are separated by isolation walls that are made of a thermal insulation material, wherein the array substrate to be evaporated comprises a substrate, a thin film transistor layer arranged on the substrate and a pixel-defining layer, and wherein the isolation walls of the evaporation source are attached to the pixel-defining layer of the array substrate to be evaporated.

2. The evaporation system according to claim 1, wherein the evaporation source further comprises a cooling device configured to cool the array substrate to be evaporated.

3. The evaporation system according to claim 1, wherein the plurality of recesses are arranged in a matrix.

4. An evaporation method used in an evaporation system according to claim 1, comprising:

depositing organic electroluminescent materials in at least some of the plurality of recesses of the evaporation source;

attaching the isolation walls of the evaporation source to the pixel-defining layer of the array substrate to be evaporated, such that the at least some recesses are aligned with sub-pixel units of the array substrate to be evaporated; and heating, by the plurality of heating sources, the organic electroluminescent materials in the at least some recesses, to form light-emitting layers in the sub-pixel units.

5. The evaporation method according to claim 4, wherein different organic electroluminescent materials are deposited in different recesses.

6. The evaporation method according to claim 4, wherein each recess of the at least some recesses is aligned with one of a single sub-pixel unit, a row of the sub-pixel units, and a column of the sub-pixel units.

7. The evaporation method according to claim 4, further comprising cooling the array substrate to be evaporated while heating the organic electroluminescent materials.

* * * * *